(12) United States Patent
Akram et al.

(10) Patent No.: US 6,495,400 B1
(45) Date of Patent: Dec. 17, 2002

(54) METHOD OF FORMING LOW PROFILE SEMICONDUCTOR PACKAGE

(75) Inventors: Salman Akram, Boise, ID (US); Larry Kinsman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/655,034

(22) Filed: Sep. 5, 2000

Related U.S. Application Data

(62) Division of application No. 09/121,272, filed on Jul. 22, 1998, now Pat. No. 6,114,770.

(51) Int. Cl.⁷ .............................................. H01L 21/50
(52) U.S. Cl. ..................................... 438/127; 438/118
(58) Field of Search .............................. 438/118, 127, 438/FOR 369, FOR 371; 257/784, 786–787, 737

(56) References Cited

U.S. PATENT DOCUMENTS

| 3,663,868 A | 5/1972 | Noguchi et al. |
| 4,622,574 A | 11/1986 | Garcia |
| 4,901,136 A | 2/1990 | Neugebauer et al. |
| 4,922,324 A | 5/1990 | Sudo |
| 5,045,921 A | 9/1991 | Lin et al. |
| 5,218,234 A | 6/1993 | Thompson et al. |
| 5,241,133 A | 8/1993 | Mullen, III et al. |
| 5,302,849 A | 4/1994 | Cavasin |
| 5,360,992 A | 11/1994 | Lowrey et al. |
| 5,583,378 A | 12/1996 | Marr et al. |
| 5,753,974 A | 5/1998 | Masukawa |

OTHER PUBLICATIONS

"Z–Axis Conductive Adhesive", Zymet Inc., 7 Great Meadow Lane, E. Hanover, NJ 07936, August 1, 1990.

*Primary Examiner*—George Fourson
*Assistant Examiner*—Thanh V Pham

(57) ABSTRACT

An embodiment of an inventive semiconductor device comprises an unpackaged semiconductor wafer section having a major surface with a plurality of bond pads thereon. A plurality of conductors each comprise a lead member and at least a portion formed within a matrix. The conductors are attached to the major surface of the wafer section. An electrical connection electrically couples each of the bond pads with at least one of the lead members. Sealing material is then formed to contact at least the bond pads and the lead members.

8 Claims, 3 Drawing Sheets

METHOD OF FORMING LOW PROFILE SEMICONDUCTOR PACKAGE

This is a division of U.S. Ser. No. 09/121,272 filed Jul. 22, 1998 and issued Sep. 5, 2000 as U.S. Pat. No. 6,114,770.

FIELD OF THE INVENTION

This invention relates to the field of semiconductor assembly, and more particularly to a low profile semiconductor device and a method for forming the device.

BACKGROUND OF THE INVENTION

Miniaturization of electronic components such as consumer electronics and industrial equipment is a typical objective of design engineers and results in a more desirable and, typically, a lower cost product. To aid with the miniaturization of electronic components, it is a goal of semiconductor device manufacturers to offer packages having progressively thinner profiles and a smaller outlines.

One type of conventional semiconductor assembly, a thin small outline package (TSOP), comprises the use of a thinner lead frame and silicon die, bond wires having a decreased loop, and a thinner encapsulation layer surrounding the die in an attempt to form a smaller, thinner package. Another type of conventional semiconductor device assembly, depicted in FIGS. 1A and 1B, is referred to as a ball grid array or "BGA" device. BGA devices typically comprise a resin substrate 10 having one or more layers of traces therein (not depicted) which in effect provides a small printed circuit board (PCB). The device further comprises an array of pads on the bottom of the substrate to which solder balls 12 are attached. A noncircuit surface of a semiconductor die 14 is mounted to a side of the substrate opposite the balls 12. Bond pads 16 on the die 14 are wire bonded 18 to the traces 20 of the substrate 10, and then the die 14, the bond wires 18 and at least a portion of the traces 20 and the substrate 10 are encased in encapsulation material 22 such as plastic. The solder balls 12 on the BGA are contacted with pads on a PCB or socket (not depicted), then the solder 12 is reflowed to electrically couple the BGA with the PCB or socket. Ceramic equivalents to this design are also known in the art as are similar devices having leads instead of balls.

While decreasing the size and cost of components such as microprocessors, memory, and logic devices are goals of designers, the design described above has elements that are contrary to optimal component size. For example, to provide trace portions to allow wire bonding, the substrate must be larger than the die. The bond wires thereby extend laterally from the die to the traces on the substrate, and the device design results in the packaged BGA requiring additional lateral space beyond that required by the die alone. With regard to economy, the multi-layered substrates required by most BGA applications can be relatively expensive.

Further, the additional heat generated as device speeds increase contributes to component failure, and a package design which efficiently dissipates heat is an engineering design goal. A less costly BGA device having a smaller footprint and improved heat dissipation than previous devices would be desirable.

SUMMARY OF THE INVENTION

The present invention provides a semiconductor device having a design that can result in a smaller semiconductor package. In accordance with one embodiment of the invention a semiconductor device comprises an unpackaged semiconductor wafer section having a major surface with a plurality of bond pads thereon. The embodiment further comprises a plurality of conductors each having at least a portion covered by a matrix and a plurality of lead members. The conductor/matrix assembly is attached to the major surface of the wafer section. An electrical connection electrically couples at least one bond pad with a respective lead member, and a sealing material contacts at least the bond pads and the lead members. Other embodiments are also described.

Objects and advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

Detailed Description of the Preferred Embodiment

Figure 1A:
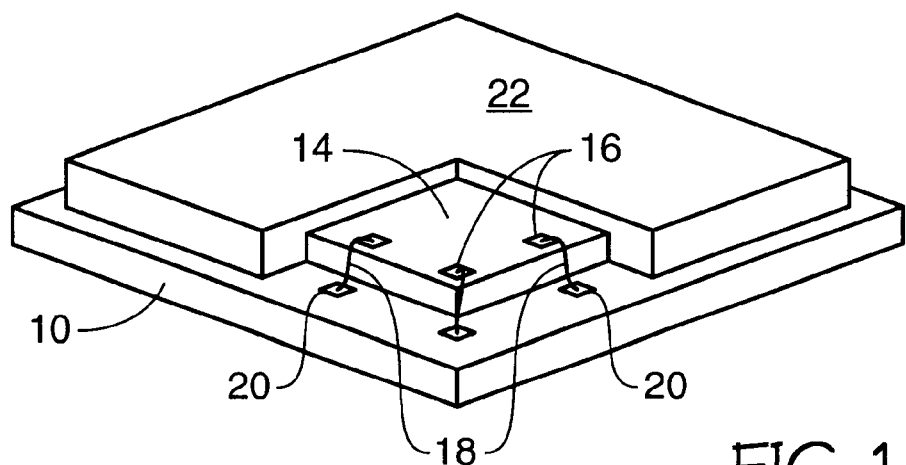
FIG. 1A is a partial cut away isometric view of a conventional ball grid array device.
Figure 1B:
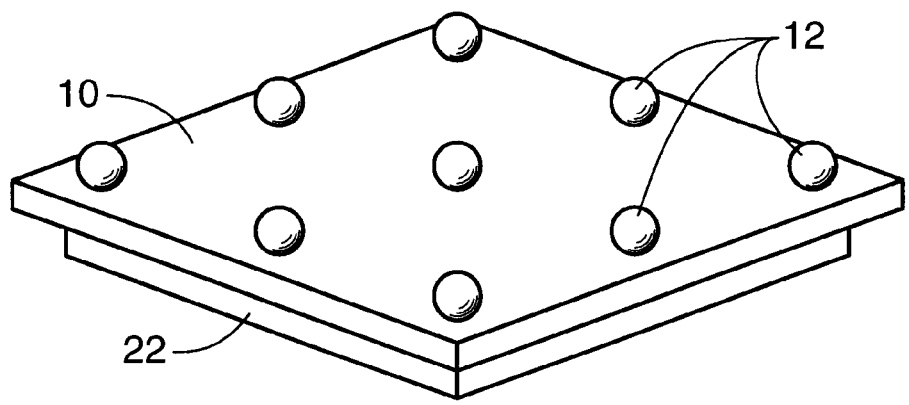
FIG. 1B is an isometric view of the bottom of the FIG. 1A device depicting solder balls on the substrate.
Figure 2:
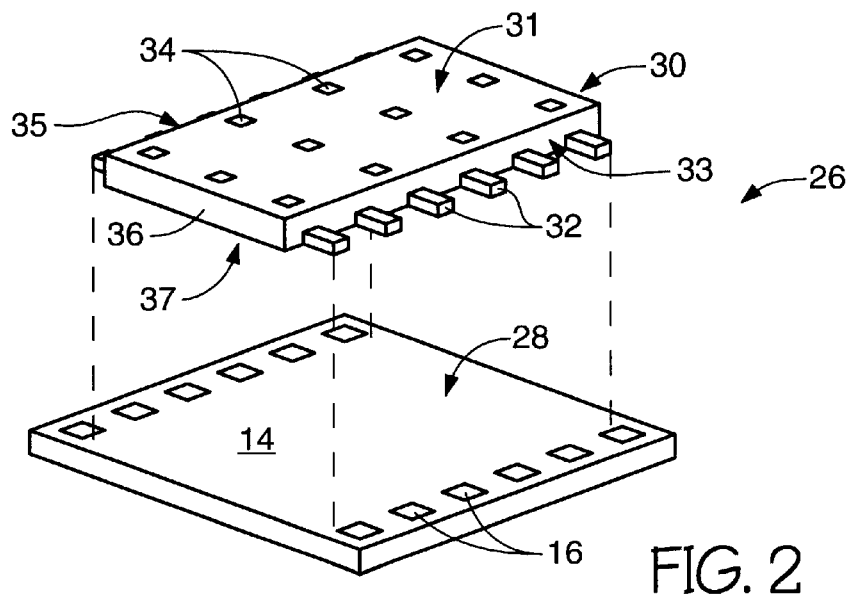
FIG. 2 is an exploded isometric view depicting an assembly step for forming one embodiment of the invention.

FIG. 2 depicts an assembly step used to form a first embodiment of an inventive ball grid array (BGA) device, illustrated generally at 26. Device 26 comprises a conventional semiconductor die 14 or other wafer section, as depicted relative to the embodiment of FIG. 1, having exposed bond pads 16 laterally located on a major surface 28 (circuit side) of the die. As depicted in FIG. 2, the wafer section 14 is generally planar across the major surface. The die 14 includes a polyimide passivating layer or another passivating material (not individually illustrated) formed over the circuit side 28 of the die. Various polyimide and other nonconductive passivating layers are known to those skilled in the art. The bond pads remain unpassivated.

Figure 4:
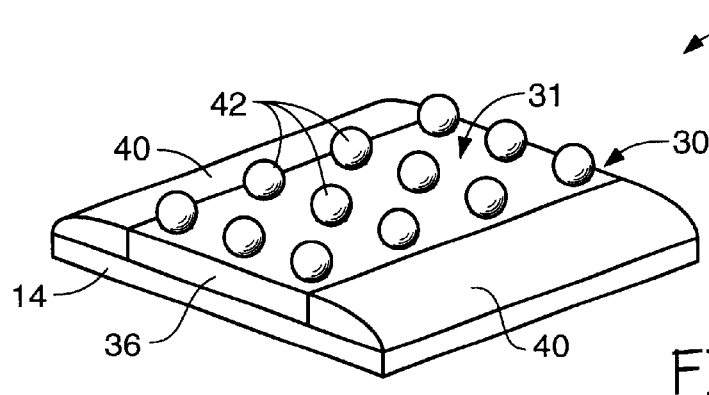
FIG. 4 is an isometric view depicting a completed embodiment of the invention.

An interconnection assembly 30 is utilized to establish contact between bond pads 16 of die 14 and contact balls, bumps, leads or other contacts illustrated as balls 42 in FIG. 4. Interconnection assembly 30 comprises a plurality of conductors (depicted unencapsulated in FIG. 5 as 52) each of which extends from a first location 32 to a second location 34. The first location 32 is configured to facilitate electrical coupling to bond pads 16, and the second location 34 is configured to facilitate electrical coupling to the contacts 42. The interconnection assembly 30 further comprises an insulation matrix 36 supporting a portion of each conductor 52. The electrically-insulating matrix 36 of the instant embodiment can comprise generally any conventional thermoset die encapsulation resins or plastics. Ideal qualities of the matrix include a material that is noncorrosive, chemically stable, thermally conductive, and electrically nonconductive.

Figure 3:
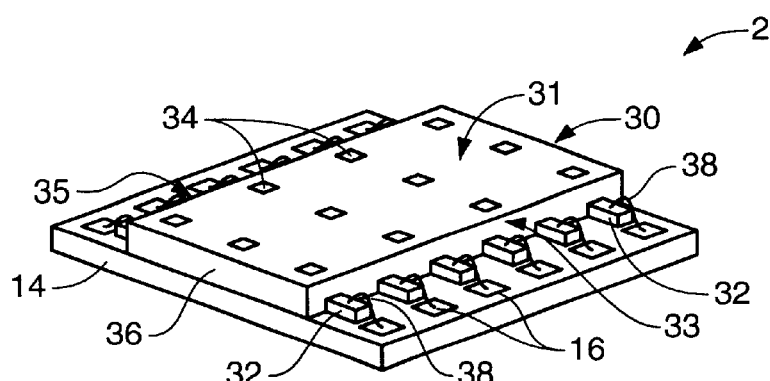
FIG. 3 is an isometric view depicting a partially assembled inventive embodiment.

In one preferred embodiment, each conductor comprises a lead section exposed at the first end 32 which can be flush with or extend beyond the adjacent surface of matrix 36. Each conductor extends through the matrix and terminates in an exposed pad portion at the second end 34 on an exterior surface 31 of the matrix 36. Thus the conductors 52 each comprise a portion encased in matrix 36 and a portion 32, 34 free from the matrix. In the embodiment of FIG. 3 the second end 34 of each conductor 52 comprises a planar surface which is generally parallel with a plane of the circuit side 28 of die 14. For purposes of illustration only, the exposed second ends 34 of the FIG. 3 embodiment are arranged in a 4×3 grid.

The interconnection assembly 30 is attached to the major surface 28 of the die 14 as depicted in FIG. 3 using a nonconductive die attach material (not depicted). Myriad nonconductive die attach materials are available, and sufficient die attach materials suitable for use with the instant invention would be recognized by one of ordinary skill in the art. At least one lead section 32 is then electrically coupled with a respective bond pad 16 as depicted in FIG. 3, for example using a bond wire 38. More preferably, a plurality of lead sections are each coupled with a respective bond pad as depicted in FIG. 3. Connection methods other than bond wires may also function adequately. Other connection methods include extending the leads and aligning them vertically with the bond pads and using a Z-axis conductive material to electrically couple the bond pads and leads, or using tape automated bonding connections to couple the leads and bond pads. Some of the bond pads may not be connected with leads, depending on the various bond options selected and eventual use of the device. Further, the interconnection assembly 30 can be connected to the die 14 at only the matrix portions, at only the exposed conductor portions, or at both the matrix and conductor portions. For purposes of this disclosure, "attaching" the interconnection assembly 30 to the die 14 includes connecting the conductors 52 to the die regardless of whether attach material is formed between the die and the conductors.

It can be seen from FIGS. 2 and 3 that in this embodiment the interconnection assembly 30 has leads protruding from first 33 and second 35 opposite surfaces of the matrix 36. The assembly further comprises a third surface 37 connected to the die 14. Second ends 34 of the conductors are exposed at a fourth surface 31 opposite the third surface 37. In this embodiment, the noncircuit side of the semiconductor die remains exposed which allows for the efficient dissipation of heat from the die.

The structure of FIG. 3 further depicts that the circuit side 28 of the die 14 which comprises the bond pads 16 faces the solder balls 42 while the back side of the die faces away from the solder balls. Thus the circuit side 28 of the die 14 is closer to the solder balls 42 than is the back side of the die. This is in contrast to the related art embodiment depicted in FIG. 1 wherein the bond pads 16 face away from the solder balls 12.

The FIG. 3 structure is generally an in-process apparatus wherein the bond wires 38, leads 32, and bond pads 16 remain exposed after wire bonding. A sealing material 40 is dispensed to contact these exposed elements as depicted in FIG. 4 and to protect the device from environmental damage. Sealing materials which would provide adequate protection and which would adhere adequately to the die and to the interconnection assembly include conventional glob-top material such as 4450 Hysol by Dexter Electronics, 2111 Tracon by Tracon Co., or Ablebond products by Ablestick. The sealing material can be dispensed by any sufficient means including syringe dispensing, stenciling, silk screen, globbing, or using encapsulation techniques. In some uses of this embodiment the sealing material may not be necessary.

Optionally, the second ends 34 of the conductors which terminate on the exterior of the interconnection assembly 30 can be bumped 42 with solder or another conductive interconnect material to provide a means for coupling with pads on a PCB or other assembly. Prior to bumping, necessary plating material can be formed to provide the desired under-bump metalization (UBM) for the solder balls. Alternately, the connection between the package and the receiving assembly can be supplied using an interconnect such as Z-axis conductor, through the use of an interconnect such as a socket assembly having contacts that provide communication with the die, or through other interconnections.

Figure 5:
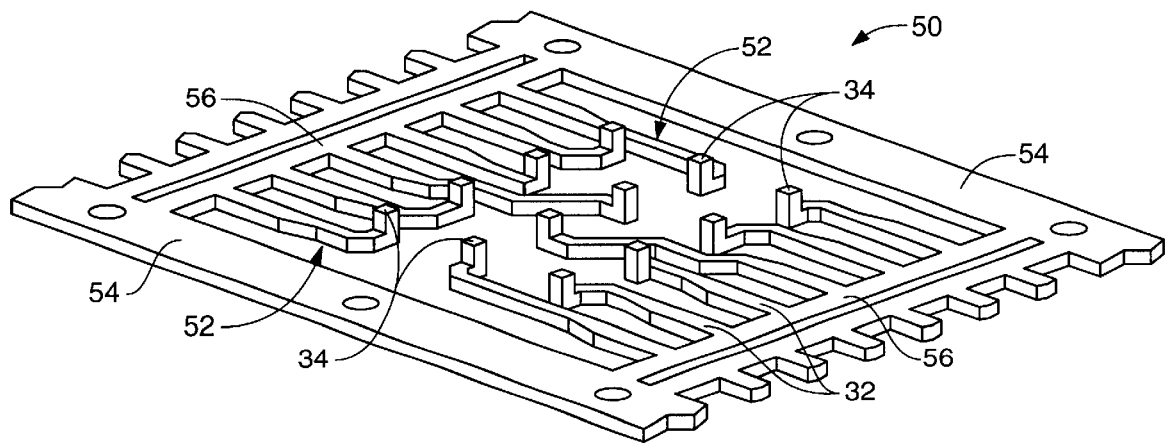
FIG. 5 is an isometric view depicting a frame for use with the inventive embodiment.

FIG. 5 depicts one possible lead frame 50 comprising conductors 52 with first 32 and second 34 ends depicted. The frame 50 of FIG. 5 is depicted before formation of the matrix 36 of FIG. 2, and before severing lead frame rails 54 and dam bars 56. The frame of FIG. 5 is placed in a mold such as a transfer, injection, or compression mold and the insulation material is formed around the conductors. The frame is removed and the scrap metal is trimmed and the excess plastic is removed. When appropriately encapsulated, the frame of FIG. 5 will form an interconnection assembly (30, FIG. 2) having exposed pads 34 arranged in a 4×3 grid.

An advantage of the instant embodiment is that the leads of the interconnection assembly 30 terminate within the perimeter of the die 14 as depicted in FIG. 2. This provides a package that requires no more lateral space on a PCB than the die itself, thereby decreasing the space required for the package over conventional BGA devices as depicted in FIG. 1.

The instant invention may also be applied to die having bond pads laterally located along any or all of one, two, three, or four sides, or bond pads centrally located on the die. Further, a variety of arrangements of conductors within the matrix can be provided. Additionally, the conductors 52 in interconnection assembly 30 may be arranged in any of a number of desired patterns. For example, the second ends can be exposed in a grid pattern or along any or all edges of the interconnect. Further, first ends 32 of the frame 52 may extend beyond the matrix 36 as illustrated in FIG. 2, or they may terminate flush with the surface of matrix 36. The second ends 34 of the conductors may further terminate in conductive pins that protrude from the surface of the matrix 36, or pins (leads) can be assembled onto the second ends 34 of the conductors, for example by soldering pins to the second ends. Either of ends 32 or 34 may be covered by matrix 36 as long as electrical connection therewith is possible, such as by a contact which pierces the matrix over the end to make electrical contact with the underlying end.

Figure 6:
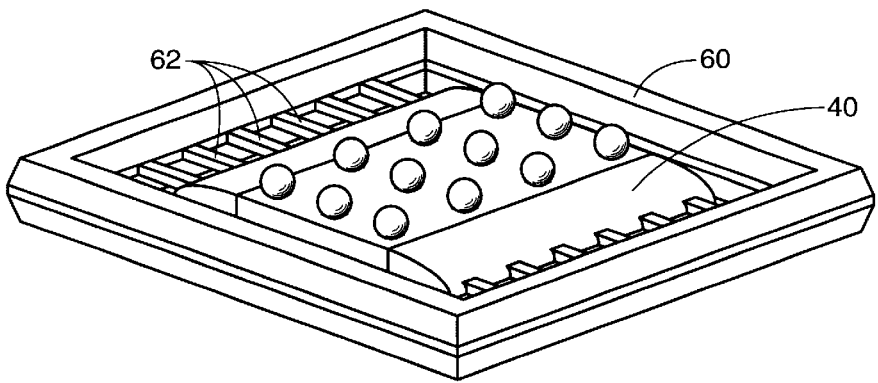
FIG. 6 is an isometric view depicting an inventive embodiment comprising a molded carrier ring.

FIG. 6 depicts an embodiment comprising a molded carrier ring (MCR) 60 which aids in the handling and testing the packaged device. After packaging and testing, the lead portions 62 that protrude from the sealing material 40 can be severed flush with the sealing material. Alternately, the leads 62 can be formed and electrical contact between the die and the PCB to which the die is attached can be made through the leads at the first ends 32 of the conductors 52, rather than through the conductor portions at the second ends 34. Forming a device with protruding leads 62 would require rerouting of the leads from the configuration depicted in FIG. 3 to allow for forming bond wires. Otherwise, the leads will cover the bond pads thereby preventing wire bonding. Alternately, the Z-axis conductor described previously can be used, or the leads can be routed near the bond pads to allow for wire bonding and routed out the package near the ends of the die having no bond pads. The leads could also be narrowed to allow for routing between the bond pads as long as at least a portion of the leads are of sufficient size to provide a surface for wire bonding.

Alternate methods for forming the device of FIGS. 2 and 3 include attaching an interconnect 30 to each die of an undiced semiconductor wafer. The wafer can be diced at this point and the wire bonding performed after dicing, or the bond wires can be attached to the bond pads and to the leads of each interconnect before dicing the wafer. Further, the sealing material can be formed to seal the bond pads, bond wires, and the exposed lead portions either before or after dicing the wafer.

In another embodiment, a plurality of undiced semiconductor die, for example eight die, are connected with an interconnect having locations for eight die in the manner described above to form a semiconductor module. Alternately, a number of individual die can be connected with one electrical interconnect having locations for a plurality of die to form a module. Such a module could include a combination of device types, such as one or more microprocessors in combination with memory and/or logic devices.

In yet another embodiment the first ends 32 of the connectors 52 are flush with the matrix 36. The electrical connection that electrically couples the first ends 32 of the conductors with the bond pads 16 on the die 14 can include tape automated bonding, wire bonding, or the formation of another type of conductive layer. Other first-end terminations can be formed depending on the individual design or particular use of the instant invention.

A semiconductor device comprising the invention could conceivably be attached along with other devices to a printed circuit board, for example to a computer motherboard or as a part of a memory module used in a personal computer, a minicomputer, or a mainframe. The inventive device could further be useful in other electronic devices related to telecommunications, the automobile industry, semiconductor test and manufacturing equipment, consumer electronics, or virtually any piece of consumer or industrial electronic equipment.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A method used in the fabrication of a semiconductor device, comprising:
   providing a semiconductor die having a major surface with a plurality of bond pads thereon and a perimeter;
   providing an interconnection assembly comprising a plurality of conductors, each conductor having a first end and a second end spaced therefrom;
   mechanically attaching said die to said interconnection assembly such that said first ends are proximate said bond pads and said first and second ends of said conductors terminate, within said perimeter of said die;
   encasing at least said second end of each said conductor within a dielectric matrix;
   subsequent to encasing at least said second end of each said conductor within said dielectric matrix, piercing said matrix to form at least one opening in said dielectric matrix exposing at least a portion of each said second end; and
   placing a contact within each said opening in said dielectric matrix such that each said contact is electrically coupled with one of said second ends of said conductor.

2. The method of claim 1 further comprising electrically coupling said first end of at least one of said conductors with at least one of said bond pads.

3. The method of claim 1 further comprising encasing a portion of each said conductor between said first and second ends in said matrix, wherein at least a portion of said first ends are free from said matrix.

4. The method of claim 1 wherein said piercing of said matrix is effected by said contact, and said placing of said contact within each said opening is performed substantially simultaneously with said piercing of said matrix.

5. The method of claim 1 further comprising forming said conductors such that each said second end comprises a portion in a plane generally parallel with a plane of said major surface of said die.

6. The method of claim 1, further comprising forming said conductors so that each second end includes a portion extending transversely to the major surface plane when assembled with the die.

7. A method used in the fabrication of a semiconductor device, comprising:
   providing a lead frame comprising at least one lead frame rail and a plurality of leads, each lead having a first end and a second end opposite said first end, and each said lead being electrically coupled to each of said leads of said plurality of leads;
   encapsulating each said lead between said first end and said second end in a matrix, and further encapsulating said first end of each said lead in said matrix;
   subsequent to encapsulating said leads, separating said matrix and said leads from said rail of said lead frame to electrically isolate each said lead from others of said plurality of leads, said matrix and said leads forming an interconnection assembly;
   providing a semiconductor die comprising a major surface, a perimeter, and a plurality of bond pads proximate said perimeter;
   attaching said interconnection assembly to said die such that said leads terminate at first and second ends within said perimeter of said die;
   piercing said matrix to provide a plurality of openings therein with one opening for each of said plurality of first ends; and
   placing a contact within each said opening in said matrix such that each said contact is electrically coupled with one first end of one of said leads.

8. The method of claim 7 wherein said piercing of said matrix is effected by said contact, and said placing of said contact within each said opening is performed substantially simultaneously with said piercing of said matrix.

* * * * *